(12) United States Patent
Mueller et al.

(10) Patent No.: US 11,092,658 B2
(45) Date of Patent: Aug. 17, 2021

(54) METHOD AND DEVICE FOR CONTROLLING A MAGNETIC RESONANCE IMAGING SYSTEM AS PART OF FUNCTIONAL MAGNETIC RESONANCE IMAGING

(71) Applicant: Siemens Healthcare GmbH, Erlangen (DE)

(72) Inventors: Edgar Mueller, Heroldsbach (DE); Andreas Greiser, Erlangen (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/804,670

(22) Filed: Feb. 28, 2020

(65) Prior Publication Data
US 2020/0275858 A1   Sep. 3, 2020

(30) Foreign Application Priority Data

Mar. 1, 2019   (DE) .......................... 102019202845.4

(51) Int. Cl.
*G01R 33/44* (2006.01)
*G01R 33/48* (2006.01)
*G01R 33/561* (2006.01)

(52) U.S. Cl.
CPC ....... *G01R 33/445* (2013.01); *G01R 33/4806* (2013.01); *G01R 33/5613* (2013.01); *G01R 33/5614* (2013.01); *G01R 33/5616* (2013.01)

(58) Field of Classification Search
CPC .............. G01R 33/445; G01R 33/5613; G01R 33/4806; G01R 33/5616; G01R 33/5614; A61B 5/055
See application file for complete search history.

(56) References Cited

U.S. PATENT DOCUMENTS

2013/0144153 A1* 6/2013 Inglis ..................... A61B 5/055
                                                        600/409
2018/0303373 A1* 10/2018 Freeman .............. A61B 5/0515

OTHER PUBLICATIONS

Van De Giessen et al: "Functional MR imaging on an open 1T MR imaging system: exploiting the advantages of an open MR imaging system for functional MR imaging"; American Journal of Neuroradiology; May 2011; vol. 32; No. 5; pp. 903-907; DOI 10.3174/ajnr. A2383; 2011.
Gati, Joseph S. et al: "Experimental Determination of the BOLD field strength dependence in vessels and tissue"; Magnetic resonance in medicine; 1997; vol. 38; No. 2; pp. 296-302; 1997.
Bieri, Oliver et al.: "Fundamentals of Balanced Steady State Free Precession MRI"; in: Journal of Magnetic Resonance Imaging; vol. 38; pp. 2-11; 2013; DOI:10.1002/jmri.24163.

(Continued)

*Primary Examiner* — James M Kish
(74) *Attorney, Agent, or Firm* — Schiff Hardin LLP

(57) ABSTRACT

In a method for controlling a magnetic resonance imaging system as part of functional magnetic resonance imaging, a main magnetic field B0 is provided having a field strength of at most 1.4 tesla at a main field magnet system (4) of the magnetic resonance imaging system (1); and a measurement is performed as part of functional magnetic resonance imaging, wherein a measurement sequence (MS) is applied that has a longer echo time TE (e.g. longer than 100 ms).

20 Claims, 2 Drawing Sheets

(56) References Cited

OTHER PUBLICATIONS

Parrish, Todd et al: "A new T2 preparation technique for ultrafast gradient-echo sequence"; Magnetic resonance in medicine; 1994; vol. 32; No. 5; pp. 652-657; 1994.
Krüger, Gunnar et al: "Neuroimaging at 1.5 Tand 3.0 T: comparison of oxygenation-sensitive magnetic resonance imaging"; Magnetic Resonance in Medicine: An Official Journal of the International Society for Magnetic Resonance in Medicine; 2001; vol. 45; No. 4; pp. 595-604; 2001.
Park, Sung-Hong et al: "Physiological and functional magnetic resonance imaging using balanced steady-state free precession"; Korean journal of radiology; 2015; vol. 16; No. 3; pp. 550-559; pISSN 1229-6929; eISSN 20058330; http://dx.doi.org/10.3348/kjr.2015.16.3.550; 2015.
German Action dated Jan. 23, 2020, Application No. 10 2019 202 845.4.
German Action dated May 20, 2020, Application No. 10 2019 202 845.4.
German Action dated Jan. 24, 2020, German Application No. 10 2019 202 845.4 (with English Translation).
German Action dated May 20, 2020, German Application No. 10 2019 202 845.4 (with English Translation).
German Decision to Grant dated Jul. 31, 2020, German Application No. 10 2019 202 845.4 (with English Translation).

\* cited by examiner

METHOD AND DEVICE FOR CONTROLLING A MAGNETIC RESONANCE IMAGING SYSTEM AS PART OF FUNCTIONAL MAGNETIC RESONANCE IMAGING

CROSS REFERENCE TO RELATED APPLICATIONS

This patent application claims priority to German Patent Application No. 102019202845.4, filed Mar. 1, 2019, which is incorporated herein by reference in its entirety.

BACKGROUND

Field

The disclosure relates to a method and to a device for controlling a magnetic resonance imaging system as part of functional magnetic resonance imaging (MRI), to a corresponding controller, and to a magnetic resonance imaging system (MRI system).

Related Art

Functional magnetic resonance imaging (fMRI) is a magnetic resonance imaging method that is capable of depicting physiological functions inside the body. In neurofunctional magnetic resonance imaging, activated areas of the brain are depicted at a relatively high spatial resolution.

Currently, neurofunctional magnetic resonance imaging is employed solely on MRI equipment having a field strength of 1.5 tesla and above (mainly in the range between 3 T and 7 T).

The basis for fMRI in MRI imaging using the typical high field strengths is the BOLD effect. This exploits a local susceptibility difference between paramagnetic deoxyhemoglobin in erythrocytes and diamagnetic oxyhemoglobin, which difference is measured dynamically over time. This is described in detail in the relevant literature on fMRI.

As part of an fMRI examination, a T2* change associated with the BOLD effect is usually measured in the human brain with a spatial and temporal resolution. The reason for employing the aforementioned high field strengths is that the T2* contrast increases with increasing field strength. Below a field strength of 1.5 T, the contrast becomes lost in the image noise and it is not possible to produce meaningful acquisitions.

In a typical fMRI measurement, a measurement and subsequent reconstruction is followed by preprocessing and data analysis. During the preprocessing, time-correction of the acquired slices is usually performed followed by motion-correction, co-registration and normalization, and also spatial smoothing. During the data analysis, brain activity is localized (based on the acquired contrast), a connectivity examined, and a related classification is made.

The disadvantage with the prior art is the relatively large amount of effort entailed in the equipment used as a result of the high magnetic field.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
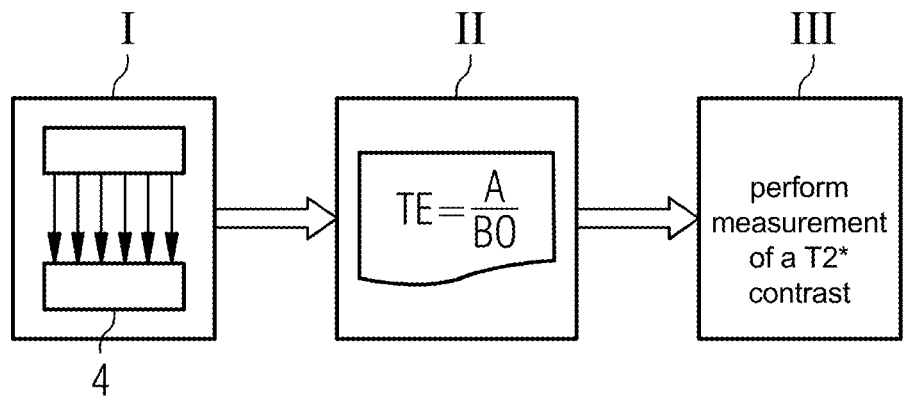
FIG. 1 is a flowchart of a method for controlling a magnetic resonance imaging system according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to define an alternative, more convenient method and a corresponding device, and a controller for controlling a magnetic resonance imaging system as part of functional magnetic resonance imaging, and a corresponding magnetic resonance imaging system, which avoids the disadvantages described above.

The method according to exemplary embodiments of the disclosure, and the device according to exemplary embodiments of the disclosure are used for controlling a magnetic resonance imaging system as part of functional magnetic resonance imaging. In practice, they can exist in particular in the form of components that can be integrated as additional components in a magnetic resonance imaging system.

In an exemplary embodiment, the method includes:
  providing a main magnetic field B0 having a field strength of at most 1.4 tesla at a main field magnet system of the magnetic resonance imaging system; and
  performing a measurement as part of functional magnetic resonance imaging, wherein a measurement sequence is applied that has a longer echo time TE ("longer" meaning here longer than normal, preferably longer than 100 ms). The measurement sequence includes radiofrequency signals (RF signals), readout signals, and in particular also gradients, with the readout being performed such that the echo times TE are preferably longer than the aforementioned 100 ms.

The longer echo time firstly has the effect that the spin system can evolve correspondingly further. This means, for example, that any small differences in T2* result in increased contrast, in other words to an increased BOLD sensitivity. For example, TE determines the contrast for T2 or T2* contrast. In the time between excitation and readout (i.e. the echo time TE), the signal, for instance in an EPI measurement, decays by T2*. The signal difference between tissue containing oxygenated vs. deoxygenated blood is the determining factor for the sensitivity of the BOLD experiment. It is therefore necessary to find the best compromise between the general signal decay TE and the oxygenated blood/deoxygenated blood signal difference.

Exemplary embodiments exploit the surprising fact that the BOLD effect can be measured even at far smaller field strengths than the minimum 1.5 T used until now. Although the BOLD effect (or the change in relaxation time, in particular T2, T2*) between partially deoxygenized blood (venous blood) and oxygenized blood (arterial blood) at lower magnetic fields is smaller than for field strengths of 1.5 T or above, it still exists. For example, surprisingly it was found during in-house trials that it was still possible to detect the BOLD effect at a field strength of 0.55 T. Unfortunately, however, this was far smaller than at 1.5 T. Therefore the acquisitions were initially unusable for medical applications.

Exemplary embodiments can use measurement technology to make this far smaller change in contrasts (e.g. a T2, T2* change essential to neurofunctional MRI) in the low field visible again by appropriately (substantially) lengthening the echo time TE in order to increase the spin dephasing relevant to this contrast (e.g. T2 and T2*). This can be achieved in practical use, for example, by lengthening the echo time TE in a gradient echo single-shot EPI sequence; for instance, the echo time TE, which at higher field strengths usually lies at around 50 ms, can be lengthened to 150 ms.

At the field strengths of 1.5 T, 3 T and 7 T mainly used today in fMRI, macroscopic field perturbations at boundaries between different tissues and e.g. air mean that an echo time TE required by the disclosure cannot be employed, because image artifacts right up to elimination of measurement signals in significant regions of the human brain preclude this. This leads to the current situation in which fMRI can be employed in certain regions of the brain only to a limited extent or not at all (e.g. for examinations of the frontal region of the brain or the *Bulbus olfactorius*), and using a longer echo time TE would lead to even more dramatically amplified image artifacts.

The possibility of using lower-cost equipment that can generate only lower main magnetic fields means that the disclosure in particular has the advantage that the gradient system can also be "relaxed", because a larger echo time TE would allow the gradients to have longer rise times.

A device, according to an exemplary embodiment of the disclosure, for controlling a magnetic resonance imaging system as part of a functional MRI measurement includes a magnetic-field generator and a measurement controller.

In an exemplary embodiment, the magnetic-field generator is configured to provide a main magnetic field B0 having a field strength of at most 1.4 tesla at a main field magnet system of the magnetic resonance imaging system. This is done by the magnetic-field generator controlling the main field magnet system or controlling systems (e.g. current amplifiers) for controlling the main field magnet system. A main field magnet system exists as standard in MRI systems.

In an exemplary embodiment, the measurement controller is configured to perform a measurement as part of functional magnetic resonance imaging, wherein a measurement sequence is applied that has a (longer) echo time TE, preferably longer than 100 ms. In an exemplary embodiment, the measurement controller is configured to generate a corresponding measurement sequence and to provide said sequence to an MRI system for a measurement in the area of functional magnetic resonance imaging, or to modify a predefined measurement sequence accordingly.

Although there currently already exist magnetic-field generators in MRI systems that can generate magnet fields of less than 1.5 T (these are present e.g. as standard in MRI systems that work with lower magnetic fields), there is no equipment in the fMRI sector which (assuming that it can actually generate main magnetic fields of less than 1.5 T) can simultaneously apply in an fMRI measurement the large echo times required here. It is the particular combination of the requirements made of the magnetic-field generator and the measurement controller as part of a measurement for functional magnetic resonance imaging that achieves the effect of the disclosure.

A controller according to an exemplary embodiment of the disclosure for controlling a magnetic resonance imaging system is configured to perform a method according to the disclosure, and/or includes a device according to the disclosure. In particular, an existing controller has been suitably modified for the purpose.

A magnetic resonance imaging system according to the disclosure includes a controller according to the disclosure.

Most of the aforementioned components of the device and/or of the controller can be implemented in full or in part in the form of software modules in a processor of a suitable device or controller. An implementation largely in software has the advantage that even devices and/or controllers already in use can be easily upgraded by a software update in order to work in the manner according to the disclosure. In this respect, the object is also achieved by a corresponding computer program product including a computer program, which can be loaded directly into a computing system and/or a memory device of a controller of a magnetic resonance imaging system and which contains program segments, in order to perform all the steps of the method according to the disclosure when the program is executed in the computing system and/or the controller. Said computer program product may include in addition to the computer program, if applicable, extra elements such as e.g. documentation and/or extra components, including hardware components, such as e.g. hardware keys (dongles etc.) for using the software.

For transfer to the computing system and/or to the controller, and/or for storage on, or in, the computing system and/or the controller, a computer-readable medium, for instance a memory stick, a hard disk or any other portable or permanently installed data storage medium can be used, on which are stored the program segments of the computer program, which program segments can be downloaded and executed by a computing system and/or a processor of the controller. For this purpose, the processor can include, for example, one or more interacting microprocessors or the like.

Further, particularly advantageous embodiments and developments of the disclosure are given in the dependent claims and in the following description, where the claims in one category of claims can also be developed in a similar way to the claims and passages of the description in another category of claims, and in particular individual features of different exemplary embodiments or variants can also be combined to create new exemplary embodiments or variants.

In a method according to exemplary embodiment, a magnetic field of field strength 1.2 tesla maximum is generated, preferably 1 tesla maximum, particularly preferably 0.8 tesla maximum.

The field strength, however, is preferably greater than 0.3 T, preferably greater than 0.5 T. It would also be possible to provide a main magnetic field having a field strength of less than half the 1.5 T typically used until now, i.e. less than 0.75

T, preferably 0.55 T or less. It can also be advantageous for the main magnetic field to have a strength in the range 0.6-0.7 T.

In an exemplary embodiment, the method includes applying a measurement sequence that has an echo time longer than 130 ms, particularly preferably longer than 150 ms, although preferably shorter than 1 s, in particular shorter than 500 ms.

In a method according to an exemplary embodiment, the echo time TE is set relative to the field strength B0 of the main magnetic field according to the formula TE=A/B0, where A preferably lies between 50 ms·T and 100 ms·T, in particular between 70 ms·T and 90 ms·T, particularly preferably between 80 ms·T and 85 ms·T. A minimum value of A preferably equals 50 ms·T, in particular 70 ms·T or 80 ms·T. A maximum value of A preferably equals 1000 ms·T, in particular 100 ms·T, preferably 90 ms·T or even 85 ms·T. Thus preferably the echo time TE is inversely proportional to the field strength B0 of the main magnetic field. The lower the field strength B0 of the main magnetic field, the longer the echo time TE should be chosen. For example, it is advantageous to choose an echo time of 150 ms for a field strength B0=0.55 T.

In a method according to an exemplary embodiment, the measurement is configured to measure a T2 contrast, a T2* contrast or a T2 prep contrast. For instance, by lengthening the echo time TE to approximately 150 ms, it is possible to recover again the BOLD sensitivity that was reduced by the initially actually far lower T2* contrast at 0.55 T.

In a method according to an exemplary embodiment, the measurement is performed by means of a balanced steady-state free precession sequence, preferably using a large flip angle. In an exemplary embodiment, a flip angle is greater than 55°, in particular greater than 70°, or actually greater than 80°. The maximum practical homogeneous flip angle in this process is 90°. This would actually be viable e.g. at 0.55 T because of the relaxed SAR situation, something that often is not the case for higher fields and fast sequences. This particular SSFP method is an imaging method in magnetic resonance imaging which uses steady states of magnetization. In general, SSFP MRI sequences are based on a gradient echo MRI sequence (using small flip angles) that has a short repetition time (TR). In most cases, the aim is to refocus the phase-encoding gradients in each repetition interval in order to keep the phase integral (or gradient moment) constant. This is achieved by bSSFP sequences. A sequence of this type is highly prone to artifacts at higher field strengths, in which case a long echo time would lead to high signal losses, and therefore this sequence cannot normally be used as part of an fMRI measurement. A T2-weighting for SSFP is implemented here typically by means of a T2 preparatory module, followed by the SSFP readout module, which typically has a very short echo time of e.g. 1.5 ms. At a lower field strength, in a similar way to increasing the echo time in single-shot EPI sequences, it is hence possible to increase the T2 preparation time length in order to enhance the contrast.

In the context of the disclosure, the bSSFP sequence exhibits very good image quality, and (unlike conventional measurements at 1.5 T or more) can be measured consistently using a high flip angle and hence a high signal-to-noise ratio.

In a method according to an exemplary embodiment, a BOLD effect is measured dynamically by means of a balanced steady-state free precession sequence in combination with T2 preparatory pulses. In an exemplary embodiment, a bSSFP sequence is used in combination with a suitable preparatory pulse, e.g. the aforementioned T2 preparatory pulse, having a sufficiently long preparation time length of e.g. 150 ms, in order to implement an fMRI readout method.

If, according to the disclosure, in contrast with a typical sequence for magnetic fields of 1.5 T or higher, the echo time TE is increased, then not only is the readout time-instant shifted, but, as a result of the larger distance from the center of k-space, there is also more time available overall between readout and excitation pulse for the readout. Hence advantageously, further changes in the sequence can be made that in particular improve the signal-to-noise ratio (SNR), i.e. improve the compensation of the SNR loss at the lower field strength. For example, the bandwidth can be reduced, and although this lengthens the readout train, it increases the SNR at least by the root of the reduction in bandwidth.

In a method according to an exemplary embodiment, readout gradients are therefore reduced in comparison with a measurement using a main magnetic field of 1.5 T (the standard parameterization). The strength of the reduced readout gradients preferably equals less than half their strength for a standard parameterization, particularly preferably a third or less (e.g. from 24 mT/m for a standard parameterization to 8 mT/m).

The gradients in the phase-encoding direction are typically small anyway within the PE blips (phase-encoding gradients) in the readout train, and according to the disclosure, can be given a low performance without significant disadvantages overall in the phase-encoding direction. The same applies to the slice-selection gradients. Thus overall, the method can be employed on a system having a low maximum gradient strength. The strength of the phase-encoding gradients and/or of the slice-selection gradients preferably equals less than half their strength for a standard parameterization, particularly preferably a third or less.

Alternatively or additionally, in an exemplary embodiment, the ramp times of some or all of the aforesaid gradients (readout gradients and/or phase-encoding gradients and/or slice-selection gradients) are increased in comparison with the standard parameterization, thereby reducing the maximum required slew rate. In an exemplary embodiment, the ramp time length of the gradients concerned is increased by 50%. For example, in a case in which for a standard parameterization the ramp time length equals 100 µs (with a typical readout time length per ADC of 1.3 ms), an increase to 150 µs would not have major consequences, and hence the required slew rate would drop from 120 T/m/s to 80 T/m/s.

In an exemplary embodiment, the method at the lower field strength can be combined extremely well with a lower gradient performance, wherein in comparison with a measurement using a main magnetic field of 1.5 T, as regards a number of readout gradients and/or phase-encoding gradients and/or slice-selection gradients they are applied at a reduced strength, wherein the strength of the gradients concerned preferably equals less than half their strength for a measurement using a main magnetic field of 1.5 T, and/or their ramp time is increased, preferably by 50%.

Another advantageous measure for improving the signal-to-noise ratio is to dispense with the measurement acceleration by means of parallel imaging. For example, the otherwise common PAT acceleration (e.g. with R=2) can be removed. Although this does result in twice the number of readouts, it also increases the SNR by approximately the square root of two. Good judgment should be exercised in particular when implementing measures for increasing the SNR, because lengthening the readout train fundamentally also increases the sensitivity to motion. Nonetheless, the readout time lengths per slice are typically around 40 ms in the initial protocol, so that a certain degree of lengthening should be possible without significantly impairing the image quality.

In a method according to an exemplary embodiment, an active or passive implant, (e.g. a deep brain stimulator) is introduced into the head of the patient before the measurement. Compared with conventional fMRI methods using magnetic fields of 1.5 T and above, this expands the range of uses to measurements in which measurement objects such as deep brain stimulators, for instance, or other active/passive implants, are present in the head.

In a method according to an exemplary embodiment, an EPI sequence (EPI: echo-planar imaging), in particular a single-shot gradient echo EPI sequence, is applied during the measurement. An EPI sequence containing very long echo times (e.g. 150 msec) allows, in comparison with high field strengths, relatively slow gradient rise times (slew rate) and moderate gradient amplitudes, resulting in cost savings in the entire gradient system. Since the patient-induced macroscopic field perturbations in the low field are correspondingly low, it also follows that the image quality for EPI is generally good by comparison. This constitutes another advantage of the disclosure.

The single-shot EPI sequence at 1.5 T or higher fields has been restricted until now to specific applications, because the aforementioned artifacts are too severe here. Thus using the values according to the disclosure for the main magnetic field (e.g. 0.55 T) presents new potential applications for single-shot EPI (beyond fMRI), and similar further changes in the sequence design can also help here to compensate for the loss in sensitivity.

A practical example of an embodiment of this type would be measuring the BOLD effect at unusually long echo times (150 ms and more) in single-shot gradient echo EPI sequences for field strengths of the main magnetic field at 0.5 T.

In a method according to an exemplary embodiment, a FLASH/spoiled gradient echo readout, which can be combined analogously with a T2 Prep pulse, takes place during the measurement. This may appear at first to be less advantageous in terms of a signal-to-noise ratio, but this is a particularly robust variant of a gradient echo method. For example, a bSSFP readout can also be replaced by a FLASH/spoiled gradient echo readout, and be combined analogously with a T2 Prep pulse.

A significant advantage of the disclosure is that the opportunity to perform measurements using lower magnetic fields than the typical 1.5 T or higher means it is also possible to use MRI systems that can generate only a lower main magnetic field than 1.5 T. Such MRI systems are usually lower in cost. A potential major cost saving here lies in the magnets for the main magnetic field, which for low field strengths require correspondingly less expensive superconducting wire.

Exemplary embodiments of the disclosure, however, not only results in lower-cost MRI systems with fMRI capability, but, by virtue of the lower hardware requirements, also results in MRI systems with fMRI capability that have a larger patient aperture. It is now also possible in applications in interventional MRI to perform fMRI tests during an intervention. The disclosure adds to the advantages of interventional MRI at low field strengths (low SAR load and hence lower requirements relating to patient safety, greater degrees of freedom in the magnet design, etc.), the advantage of the opportunity to use fMRI.

In the discipline of neuroscience, the exemplary embodiments of the disclosure allows access to measurements in regions of the brain that are difficult to access because of the high magnetic fields currently used. For example, applications in the field of psychiatry or of research into depression seem possible.

FIG. 1 shows a flowchart of a method, according to an exemplary embodiment of the disclosure, for controlling a magnetic resonance imaging system as part of an fMRI measurement.

Figure 3:
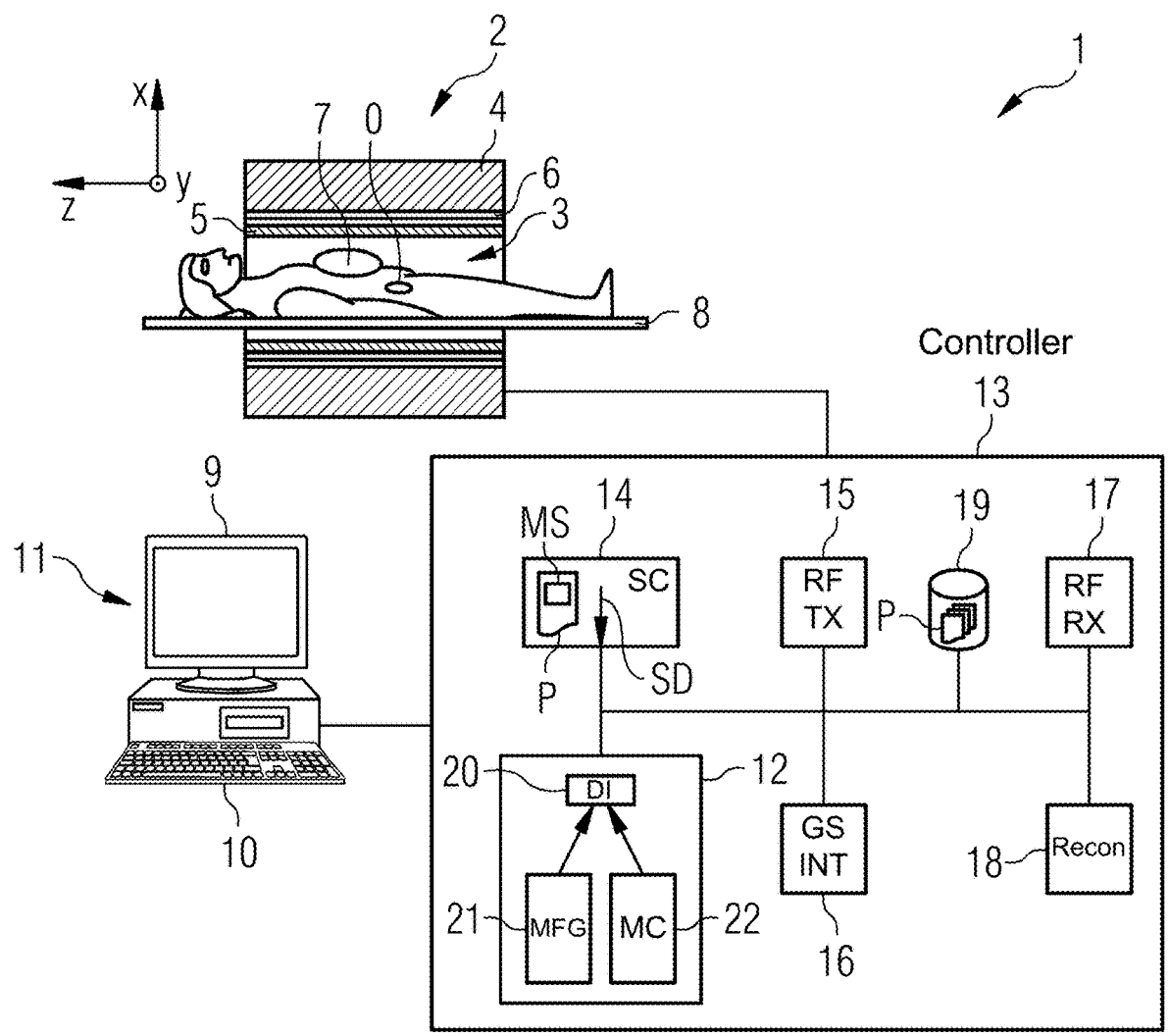
FIG. 3 illustrates a magnetic resonance imaging system according to an exemplary embodiment of the disclosure.

In step I, a main magnetic field B0 having a field strength of e.g. 0.55 tesla is provided at a main field magnet system 4 of the magnetic resonance imaging system 1 (see e.g. FIG. 3 for the layout of an MRI system).

In step II, an echo time TE is calculated as a function of the provided main magnetic field B0 according to the formula TE=A/B0. For example, an echo time TE=150 ms is obtained here.

In step III, a measurement of a T2* contrast is performed as part of functional magnetic resonance imaging, for instance using a balanced steady-state free precession sequence or an EPI sequence containing the calculated echo time TE of 150 ms.

Figure 2:
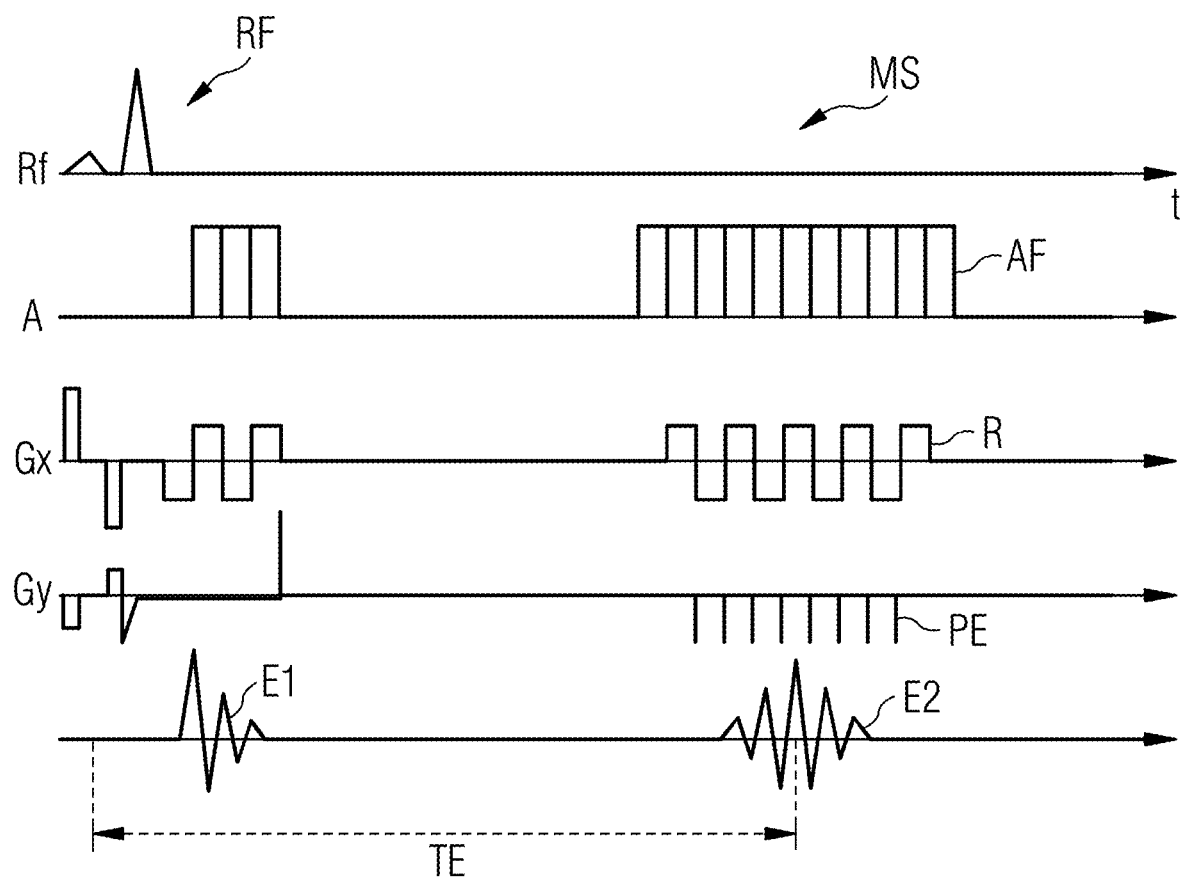
FIG. 2 illustrates an example of a measurement sequence according to an exemplary embodiment.

FIG. 2 shows an example of a measurement sequence MS. In this example, an echo-planar imaging (EPI) Blood oxygenation level dependent (BOLD) sequence is depicted. At the start, two RF pulses RF are applied, which produce two different echoes E1, E2. Slice-selection gradients (not shown here) can be used in parallel therewith to encode a slice. For the readout by means of an analog-to-digital converter (ADC), readout windows AF are opened at said converter by applying suitable signals. The readout then takes place using readout gradients R, which in this case are applied on a gradient axis Gx, while phase-encoding gradients PE are applied on the other gradient axis Gy.

Compared with a typical sequence for magnetic fields of 1.5 T (the standard parameterization), both the readout gradients R and the phase-encoding gradients PE are reduced in strength (e.g. to a half or a third). In addition, the ramp times of these gradients are increased by half compared with the standard parameterization.

FIG. 3 shows a schematic diagram of a magnetic resonance imaging (MRI) system 1 according to an exemplary embodiment. The MRI system 1 includes a magnetic resonance (MR) scanner 2 containing an examination space 3 or patient tunnel, into which is positioned, on a couch 8, a patient or person under examination, in whose body is located the actual subject under examination O, which may also be referred to as the "examination region" O.

In an exemplary embodiment, the magnetic resonance scanner 2 includes a main field magnet system 4, a gradient system 6 and also an RF transmit antenna system 5 and an RF receive antenna system 7. In the exemplary embodiment shown, the RF transmit antenna system 5 is a body coil that is fixed in the magnetic resonance scanner 2, whereas the RF receive antenna system 7 includes of local coils (represented in the figure by a single local coil) arranged on the patient or person under examination. In principle, however, the body coil can also be used as the RF receive antenna system, and the local coils can be used as the RF transmit antenna system, provided these coils can each be switched into different operating modes.

In an exemplary embodiment, the main field magnet system 4 is configured to generate a main magnetic field in the longitudinal direction of the patient, i.e. along the longitudinal axis of the magnetic resonance scanner 2, which axis extends in the z-direction. According to the disclosure, the magnetic field has a field strength of less than the 1.5 T that is typically used. For example, a main magnetic field is generated that has a field strength of 0.55 T.

In an exemplary embodiment, the gradient system 6 includes individually controllable gradient coils in order to be able to switch gradients in the x-, y- or z-direction independently of one another.

The magnetic resonance imaging system shown in FIG. 3 is a full-body system including a patient tunnel, into which a patient can be placed completely. In principle, however, the disclosure can also be used on other magnetic resonance imaging systems, for instance having a C-shaped enclosure that is open at the side. The only essential element is that suitable acquisitions of the subject under examination O can be produced.

In an exemplary embodiment, the magnetic resonance imaging system 1 also includes a central controller 13, which is configured to control the MR system 1. In an exemplary embodiment, the central controller 13 includes a sequence controller 14. This is used to control the succession of radiofrequency pulses (RF pulses) and gradient pulses according to a selected measurement sequence MS (also called a "pulse sequence") or according to a succession of a plurality of measurement sequences MS for acquiring a plurality of slices in a volume of interest of the subject under examination within a measurement session. Said measurement sequence PS can be specified and parameterized in a measurement protocol or control protocol P, for example. Different control protocols P for different measurements or measurement sessions are typically stored in a memory 19, and can be selected (and possibly modified if required) by an operator, and then used to perform the measurement. In the present case there are control protocols for acquiring a multiplicity of MRI acquisitions B1, B2, B3, B4 using a variety of acquisition parameters. In an exemplary embodiment, the controller 13 (including one or more components therein) includes processor circuitry that is configured to perform one or more functions and/or operations of the controller 13 (and one or more respective functions of the component(s) therein).

In an exemplary embodiment, for the output of the individual RF pulses of a measurement sequence MS, the central controller 13 includes a radiofrequency transmitter 15, which generates, amplifies and feeds the RF pulses into the RF transmit antenna system 5 via a suitable interface (not shown in detail). The controller 13 includes a gradient system interface 16 for controlling the gradient coils of the gradient system 6 in order to switch the gradient pulses suitably according to the specified measurement sequences MS.

In an exemplary embodiment, the controller 13 also includes a radiofrequency receiver 17 (likewise communicating with the sequence controller 14 in a suitable manner) in order to receive magnetic resonance signals within the readout window defined by the pulse sequence PS in a coordinated manner by means of the RF receive antenna system 7, and hence to acquire the raw data.

In an exemplary embodiment, the reconstructor 18 receives in this case the acquired raw data and reconstructs therefrom MRI acquisitions B1, B2, B3, B4. Again, this reconstruction is usually performed on the basis of parameters, which can be specified in the measurement protocol or control protocol P concerned. This image data can then be stored in a memory 19, for example. In an exemplary embodiment, the reconstructor is a reconstruction processor.

The principles of how suitable raw data can be acquired by applying RF pulses and switching gradient pulses, and how MR images or parameter maps can be reconstructed from said raw data, are known in detail to a person skilled in the art and therefore are not explained further here.

The controller 13 of the magnetic resonance imaging system 1 shown includes a device 12. In an exemplary embodiment, the device 12 includes a data interface 20, by which it is possible to send control data to the rest of the components of the controller 13, and includes a magnetic-field generator 21 and a measurement controller 22. In an exemplary embodiment, the device 12 (including one or more components therein) includes processor circuitry that is configured to perform one or more functions and/or operations of the device 12 (and one or more respective functions of the component(s) therein).

In an exemplary embodiment, the magnetic-field (MF) generator 21 is configured to provide a main magnetic field B0 having a field strength of at most 1.4 tesla at the main field magnet system 4 of the magnetic resonance imaging system 1. This is done here by the magnetic-field generator 21 sending control data by means of the data interface 20 to the main field magnet system 4 and thereby controlling said system. In an exemplary embodiment, the MF generator 21 includes processor circuitry that is configured to perform one or more functions and/or operations of the MF generator 21.

In an exemplary embodiment, the measurement controller 22 is configured to perform a measurement as part of functional magnetic resonance imaging. In an exemplary embodiment, a measurement sequence is applied that has an echo time TE longer than 100 ms. This is done here by the measurement controller 22 sending control data via the data interface 20 to the sequence controller 14 and thereby controlling the sequence controller 14 accordingly. Alternatively, in an exemplary embodiment, the measurement controller 22 can also generate measurement sequences MS, and then save these measurement sequences in the memory 19, so that they can be retrieved as required. In an exemplary embodiment, the measurement controller 22 includes processor circuitry that is configured to perform one or more functions and/or operations of the measurement controller 22.

Alternatively, in an exemplary embodiment, the rest of the components of the magnetic resonance imaging system 1 can be specifically configured to implement the device 12 according to the disclosure. For example, the sequence controller 14 can take on a function of the device 12.

The central controller 13 can be operated via a terminal 11 having an input interface 10 and a display 9, by means of which an operator can hence also operate the entire magnetic resonance imaging system 1. Magnetic resonance images can also be displayed on the display 9, and it is possible to use the input interface 10, if applicable in combination with the display 9, to plan and start measurements, and in particular to select and, if applicable, modify control protocols P.

Furthermore, in an exemplary embodiment, the magnetic resonance imaging system 1 according to the disclosure and in particular the controller 13 can also include a multiplicity of further components, which are not shown here in detail but are typically present in systems of this type, for instance components such as a network interface for connecting the entire system to a network and for allowing the transfer of raw data and/or image data and/or parameter maps, but also other data such as patient-related data or control protocols, for example.

The principles of how suitable raw data can be acquired by applying RF pulses and generating gradient fields, and how magnetic resonance imaging images can be reconstructed from said raw data, are known to a person skilled in the art and are not explained further here. Likewise, a huge variety of measurement sequences such as e.g. EPI measurement sequences or other measurement sequences for generating diffusion-weighted images are known in principle to a person skilled in the art.

Finally, it should be reiterated that the method described in detail above and the presented magnetic resonance imaging system 1 are merely exemplary embodiments, which can be modified by a person skilled in the art in many ways without departing from the scope of the disclosure. In addition, the use of the indefinite article "a" or "an" does not rule out the possibility of there also being more than one of the features concerned. Likewise, the terms "unit" and "module" do not exclude the possibility that the components in question consist of a plurality of interacting sub-components, which may also be spatially distributed if applicable.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for controlling a magnetic resonance imaging (MRI) system for functional magnetic resonance imaging, comprising:
providing, by a magnet generator, a main magnetic field having a field strength of at most 1.4 T at a main field magnet system of the MRI system; and
providing, by a measurement controller, an echo-planar imaging (EPI) measurement sequence to the MRI system to perform a measurement as part of functional magnetic resonance imaging, wherein the EPI measurement sequence is a single-shot gradient echo EPI measurement sequence having an echo time longer than 100 ms and shorter than 500 ms, the echo time being set based on the field strength of the main magnetic field according to TE=A/B0, where the echo time is TE, the main magnetic field is B0, and A has a minimum value of 70 ms·T.

2. The method as claimed in claim 1, wherein the generated main magnetic field has a field strength of at most 1 T and greater than 0.3 T.

3. The method as claimed in claim 1, wherein the measurement sequence applied has an echo time longer than 150 ms and shorter than 500 ms.

4. The method as claimed in claim 1, wherein A has a maximum value of 90 ms·T.

5. The method as claimed in claim 1, wherein A has a maximum value of 100 ms·T.

6. The method as claimed in claim 1, wherein the measurement is configured to measure a T2 contrast or a T2* contrast.

7. The method as claimed in claim 1, wherein the measurement is performed by a balanced steady-state free precession sequence using a flip angle that is greater than 55°, wherein a Blood oxygenation level dependent (BOLD) effect is measured dynamically by the balanced steady-state free precession sequence in combination with T2 preparatory pulses.

8. The method as claimed in claim 1, wherein:
readout gradients, phase-encoding gradients, and/or slice-selection gradients are applied at a reduced strength of 8 mT/m or less, and/or
a ramp time of the number of readout gradients, phase-encoding gradients, and/or slice-selection gradients is 150 μs.

9. The method as claimed in claim 1, wherein an active or passive implant is introduced into a head of the patient before the measurement.

10. The method as claimed in claim 9, wherein the active or passive implant is a deep brain stimulator.

11. The method as claimed in claim 1, wherein a Fast low angle shot magnetic resonance imaging (FLASH)/spoiled gradient echo readout is used to obtain the measurement.

12. The method as claimed in claim 11, wherein the FLASH/spoiled gradient echo readout is combined analogously with a T2 Prep pulse.

13. The method as claimed in claim 1, wherein the echo time is inversely proportional to the field strength of the main magnetic field.

14. The method as claimed in claim 1, wherein the generated main magnetic field has a field strength greater than 0.2 T and at most 1 T.

15. A computer program product having a computer program which is directly loadable into a memory of a controller of the MRI system, when executed by the controller, causes the MRI system to perform the method as claimed in claim 1.

16. A non-transitory computer-readable storage medium with an executable program stored thereon, that when executed, instructs a processor to perform a method for controlling a magnetic resonance imaging (MRI) system for functional magnetic resonance imaging, wherein the method comprises:
controlling MRI system to provide a main magnetic field having a field strength of at most 1.4 T at a main field magnet system of the MRI system; and
providing, to the MRI system, a balanced steady-state free precession sequence using a flip angle that is greater than 55° to perform a measurement as part of functional magnetic resonance imaging, wherein:
the balanced steady-state free precession sequence has an echo time longer than 100 ms and shorter than 500 ms, the echo time being set based on the field strength of the main magnetic field according to TE=A/B0, where the echo time is TE, the main magnetic field is B0, and A has a minimum value of 70 ms·T, and
a Blood oxygenation level dependent (BOLD) effect is measured dynamically by the balanced steady-state free precession sequence in combination with T2 preparatory pulses.

17. A device for controlling a magnetic resonance imaging system as part of functional magnetic resonance imaging, comprising:
a magnetic-field generator configured to provide a main magnetic field having a field strength of at most 1.4 T at a main field magnet system of the magnetic resonance imaging system; and
a measurement controller configured to provide a measurement sequence having an echo time that is longer than 100 ms and shorter than 500 ms, and perform a Fast low angle shot magnetic resonance imaging (FLASH)/spoiled gradient echo readout, to perform a measurement as part of the functional magnetic resonance imaging, the FLASH/spoiled gradient echo readout being combined analogously with a T2 preparatory pulse, wherein the echo time is set based on the field strength of the main magnetic field according to TE=A/B0, where the echo time is TE, the main magnetic field is B0, and A has a minimum value of 70 ms·T.

18. The device as claimed in claim 17, wherein the echo time is longer than 150 ms and shorter than 500 ms.

19. A controller for controlling the magnetic resonance imaging system, comprising the device as claimed in claim 17.

20. A magnetic resonance imaging (MRI) system comprising:
a MRI scanner, and
a controller including the device of claim 17 that is configured to control the MRI scanner.

* * * * *